(12) United States Patent
Russell et al.

(10) Patent No.: US 11,825,638 B1
(45) Date of Patent: *Nov. 21, 2023

(54) CLIMATE CONTROL SYSTEM (71) Applicant: UIPCO, LLC, San Antonio, TX (US)

(72) Inventors: Ryan Thomas Russell, The Colony, TX (US); Nathan Lee Post, Rockport, TX (US); Bryan J. Osterkamp, New Braunfels, TX (US); William Preston Culbertson, II, Plant City, FL (US); Courtney St. Martin, Duluth, GA (US); Ashley Raine Philbrick, San Antonio, TX (US)

(73) Assignee: UNITED SERVICES AUTOMOBILE ASSOCIATION (USAA), San Antonio, TX (US)

( * ) Notice: Subject to any disclaimer, the term of this patent is extended or adjusted under 35 U.S.C. 154(b) by 297 days.

This patent is subject to a terminal disclaimer.

(21) Appl. No.: 17/107,655

(22) Filed: Nov. 30, 2020

Related U.S. Application Data

(63) Continuation of application No. 16/593,788, filed on Oct. 4, 2019, now Pat. No. 10,893,634.

(60) Provisional application No. 62/786,139, filed on Dec. 28, 2018.

(51) Int. Cl.
*H05K 7/20* (2006.01)
(52) U.S. Cl.
CPC ..... *H05K 7/20827* (2013.01); *H05K 7/20836* (2013.01)
(58) Field of Classification Search
CPC .............................. H05K 7/20; H05K 7/20709
See application file for complete search history.

(56) References Cited

U.S. PATENT DOCUMENTS

| | | | |
|---|---|---|---|
| 8,365,176 B2 * | 1/2013 | Campbell | G06F 9/5094 713/320 |
| 9,939,796 B2 | 4/2018 | Dawson et al. | |
| 10,590,689 B2 * | 3/2020 | Chokshi | E04B 2/827 |
| 10,893,634 B1 * | 1/2021 | Russell | H05K 7/20836 |
| 2005/0086876 A1 * | 4/2005 | Clark | E05F 15/632 52/79.1 |
| 2006/0047808 A1 * | 3/2006 | Sharma | G06F 9/5094 709/224 |
| 2009/0302124 A1 * | 12/2009 | Dawson | F24F 11/63 236/49.3 |

(Continued)

*Primary Examiner* — Vincent H Tran
(74) *Attorney, Agent, or Firm* — Plumsea Law Group, LLC (57) ABSTRACT

A climate control system may include an electronic equipment room including one or more interior partitions dividing the chamber into two or more subchambers. The system may further include a cooling system configured to provide the subchambers with different levels of cooling, wherein at least one partition is movable from a first position defining a first subchamber to a second position defining a second subchamber in a different area of the room than the first subchamber. The system may also include a controller including instructions for controlling operation of the movable partition based on cooling requirements of the electronic equipment in the room; a first heating, ventilation, and air conditioning (HVAC) unit and a second HVAC unit, each configured to provide cooling to a different subchamber of the electronic equipment room; and a third HVAC unit configured to provide backup for the first HVAC unit and/or the second HVAC unit.

15 Claims, 7 Drawing Sheets

(56) References Cited

U.S. PATENT DOCUMENTS

| | | | | |
|---|---|---|---|---|
| 2010/0082178 | A1* | 4/2010 | Dawson | G05D 23/1932 |
| | | | | 700/299 |
| 2011/0093856 | A1* | 4/2011 | Campbell | G06F 9/5094 |
| | | | | 718/102 |
| 2011/0161968 | A1* | 6/2011 | Bash | G06F 9/5094 |
| | | | | 718/102 |
| 2011/0247348 | A1* | 10/2011 | Mashiko | F28D 20/021 |
| | | | | 62/62 |
| 2012/0005683 | A1* | 1/2012 | Bower, III | G06F 9/5094 |
| | | | | 718/103 |
| 2012/0016526 | A1* | 1/2012 | Burton | F24F 11/30 |
| | | | | 700/278 |
| 2012/0303164 | A1* | 11/2012 | Smith | H05K 7/20836 |
| | | | | 700/276 |
| 2013/0120929 | A1* | 5/2013 | Bianculli | G06F 1/189 |
| | | | | 361/679.46 |
| 2013/0293017 | A1* | 11/2013 | Englert | H02J 9/04 |
| | | | | 307/65 |
| 2014/0059945 | A1* | 3/2014 | Gardner | E04B 1/34357 |
| | | | | 52/64 |
| 2015/0204566 | A1 | 7/2015 | Dawson et al. | |
| 2017/0046640 | A1* | 2/2017 | Varadi | F24F 11/30 |
| 2018/0058122 | A1* | 3/2018 | Lang | E06B 3/46 |
| 2019/0202377 | A1* | 7/2019 | Mizutani | B62D 31/025 |

* cited by examiner

CLIMATE CONTROL SYSTEM

CROSS-REFERENCE TO RELATED APPLICATIONS

This application is a continuation of Russell et al., U.S. patent application Ser. No. 16/593,788, filed Oct. 4, 2019, and entitled "Climate Control System," which claims priority to U.S. Provisional Patent Application No. 62/786,139, filed Dec. 28, 2018. The entire disclosures of the applications listed above are hereby incorporated by reference.

TECHNICAL FIELD

The present disclosure generally relates to electronic equipment rooms and, more particularly, to systems and methods for managing cooling in electronic equipment rooms, including zoned cooling systems.

BACKGROUND

Electronic equipment typically generates heat. Indoor areas that house multiple pieces of electronic equipment (such as server rooms, data centers, etc.) can generate significant amounts of heat such that the indoor areas require climate control, such as cooling. Air conditioning and other kinds of cooling measures, such as ventilation, fans, etc., are often used to ensure that the equipment does not overheat.

In some cases, different pieces of equipment in the same room may have different cooling requirements. For example, an older piece of equipment may require a much lower ambient temperature than newer, more robust equipment. However, the entire room must be climate controlled to the lowest temperature required of any single piece of equipment in the room. This is inefficient in terms of both energy and cost, and may not be best suited for certain pieces of equipment (e.g., some equipment may not be well served by being housed in such cold temperatures).

There is a need in the art for a system and method that addresses the shortcomings discussed above. In particular, there is a need in the art for a disaster condition monitoring system.

SUMMARY

In one aspect, the present disclosure is directed to a climate control system for electronic equipment. The system may include an electronic equipment room including a plurality of peripheral walls defining a chamber configured to receive a plurality of pieces of electronic equipment and having one or more interior partitions dividing the chamber into two or more subchambers. In addition, the system may also include a cooling system configured to provide the two or more subchambers with different levels of cooling, wherein at least one partition of the one or more interior partitions is movable from a first position defining a first subchamber to a second position defining a second subchamber in a different area of the room than the first subchamber.

In another aspect, the present disclosure is directed to a climate control system for electronic equipment. The system may include an electronic equipment room including a plurality of peripheral walls defining a chamber configured to receive a plurality of pieces of electronic equipment and having one or more interior partitions dividing the chamber into two or more subchambers. Also, the system may include a cooling system configured to provide the two or more subchambers with different levels of cooling, wherein the room contains two or more pieces of equipment configured to handle internet data. Further, the system may include a system controller having a device processor and a non-transitory computer readable medium including instructions executable by the device processor for directing internet traffic through equipment disposed in a subchamber receiving a higher level of cooling.

In another aspect, the present disclosure is directed to a method for cooling electronic equipment. The method may include receiving, with a system controller, thermal requirements information from electronic equipment in a first area of a data center chamber, the system controller including a device processor and a non-transitory computer readable medium including instructions stored thereon and executable by the device processor. The method may also include receiving, with the system controller, thermal requirements information from electronic equipment in a second area of a data center, and comparing, with the system controller, the thermal requirements of the equipment in the first area to the thermal requirements of the equipment in the second area. Further, the method may include controlling operation of a movable partition based on the comparative cooling requirements of the electronic equipment in the first and second areas to selectively divide the data center chamber into two or more subchambers, including a first subchamber including the first area of the data center chamber and the second subchamber including the second area of the data center chamber. Also, the method may include operating a cooling system to provide the first subchamber and the second subchamber with different levels of cooling from one another based on the comparative cooling requirements of the electronic equipment in the first and second areas.

Other systems, methods, features, and advantages of the disclosure will be, or will become, apparent to one of ordinary skill in the art upon examination of the following figures and detailed description. It is intended that all such additional systems, methods, features, and advantages be included within this description and this summary, be within the scope of the disclosure, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DESCRIPTION OF EMBODIMENTS

The present disclosure is directed to a climate control system for electronic equipment. The system may include an electronic equipment room including a plurality of peripheral walls defining a chamber configured to receive a plurality of pieces of electronic equipment. The equipment room may include one or more interior partitions dividing the chamber into two or more subchambers. The system may also include a cooling system configured to provide the two or more subchambers with different levels of cooling. In some embodiments, the system may also include a controller configured to direct significant heat generating computing processes to equipment disposed in subchambers that receive a higher level of cooling.

In some embodiments, the partitioning of the room may be changed according to the heat intensity of computer processing in different parts of the equipment room. For example, the system may be configured to reposition a movable partition in order to redefine the subchambers into which the room is divided. The repositioning of the movable partition may be controlled based on the thermal requirements of equipment in different areas of the room. This may provide flexibility with the arrangement of equipment in the room. Further, in some embodiments, this control may be dynamic, involving the repositioning of the movable partition based on the processing demands placed on equipment in different areas of the room at a given time.

Figure 1:
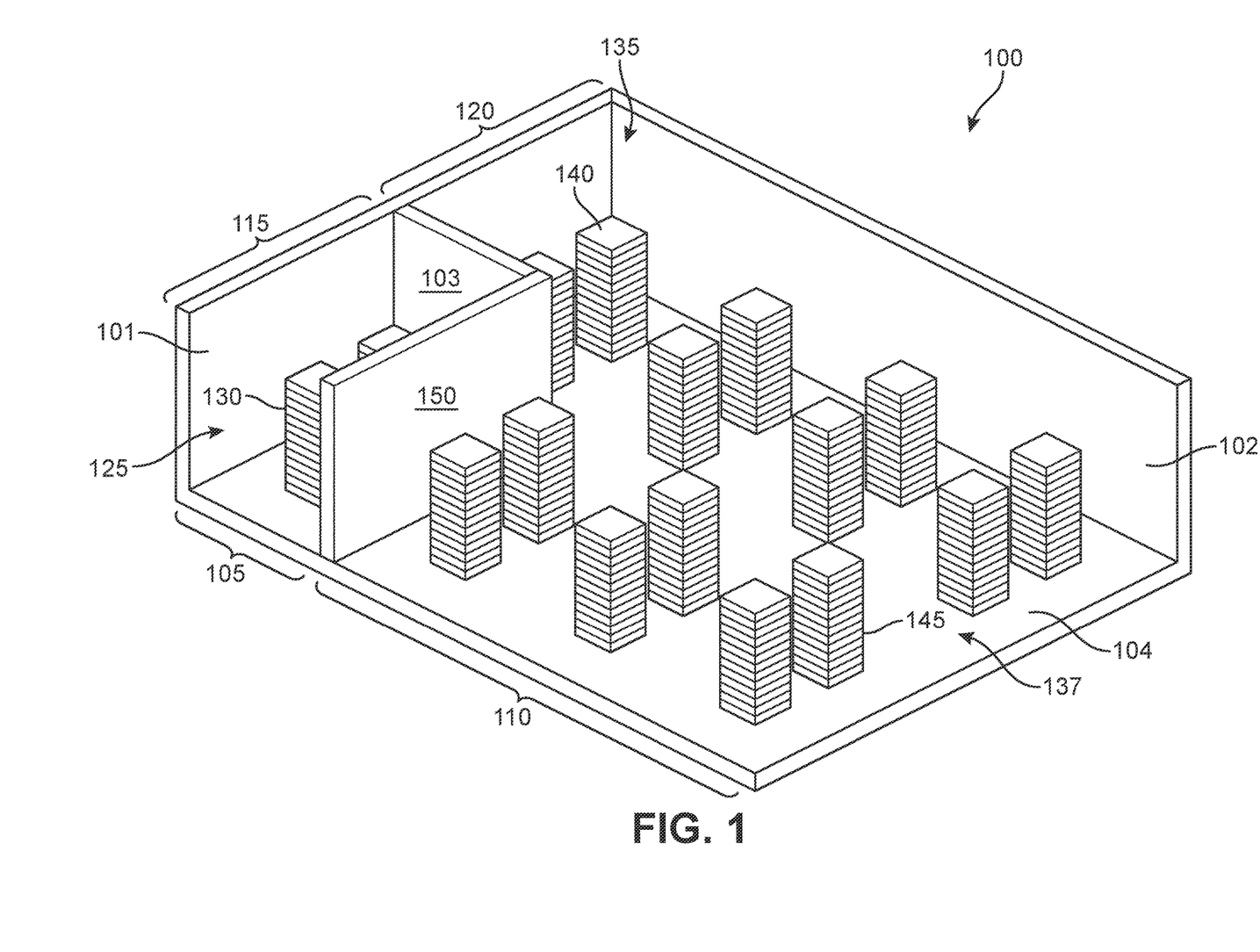
FIG. 1 is a schematic top perspective view of an electronic equipment room with two walls and the ceiling removed for purposes of illustration and showing a movable wall partition in a first position.

FIG. 1 is a schematic top perspective view of an electronic equipment room with two walls and the ceiling removed for purposes of illustration and showing a movable wall partition in a first position. The equipment shown in FIG. 1 is intended to be generic. The pillars in FIG. 1 represent stacks of electronic equipment components, such as computer servers. Other types of equipment that may be suitable for use in a climate-controlled room may include audio-visual equipment, electrical power distribution equipment, various types of computing equipment, and any other electrical equipment that can requires cooling or otherwise must be operated in ambient temperatures below a predetermined threshold. Thus, such an electronic equipment room may be found at a variety of locations, such as data centers for handling internet traffic, computing centers for handling computing processes of businesses or educational institutions, and other heavily electronic establishments, such as amusement parks, theaters, performing arts centers, etc.

As shown in FIG. 1, an electronic equipment room 100 may include a plurality of peripheral walls defining a chamber configured to receive a plurality of pieces of electronic equipment. For example, room 100 is defined by a first peripheral wall 101 and a second peripheral wall 102. The opposing peripheral walls are not shown for purposes of illustration. In addition, the room is also defined by a floor 104 and a ceiling (not shown). The geometry of room 100 is illustrated as being generally rectangular. However, in some embodiments, the room may have other geometries.

As shown in FIG. 1, room 100 includes a length divided into a first length portion 105 and a second length portion 110. Room 100 also includes a width having a first width portion 115 and a second width portion 120. Room 100 may include one or more interior wall partitions. For example, as shown in FIG. 1, room 100 may include a first interior wall partition 103. Further, room 100 may include a second interior wall partition 150. As shown in FIG. 1, a first area 125 of room 100 may be defined by first peripheral wall 101, first interior wall partition 103, second interior wall partition 150, and the additional peripheral wall (not shown). First area 125 may be further defined by floor 104 and the ceiling (not shown). Thus, first area 125 is located in the region defined by first length portion 105 and first width portion 115.

As also shown in FIG. 1, a second area 135 is located in the region defined by first length portion 105 and second width portion 120. A third area 137 is located in the region defined by second length portion 110 and the full width of room 100 (i.e., first width portion 115 and second width portion 120 combined).

Pieces of electronic equipment may be disposed in first area 125, second area 135, and/or third area 137. For example, a first piece of equipment 130 is disposed in first area 125. A second piece of equipment 140 is disposed in second area 135. In some embodiments, at least a third piece of equipment 145 is disposed in third area 137. As noted above, each of these identified items may be a stack of components, such as servers. For purposes of this discussion, since all components in a given stack are disposed in the same area of the room, the identified stacks will each be referred to as a "piece" of equipment. It will be understood, however, that a "piece" of equipment may refer to one electronic device, or multiple electronic devices disposed in the same location.

In the configuration shown in FIG. 1, with interior wall partition 150 enclosing first area 125, two areas are defined within room 100, since second area 135 and third area 137 are combined to form one large area. These two areas may be provided with different levels of cooling. For purposes of this specification and claims, the term "cooling" shall refer to at least three different aspects of maintaining electronic equipment in an acceptable temperature range. In particular, "cooling" shall refer to maintaining the ambient temperature within the equipment room (or within a subchamber of an equipment room) at a cool temperature. Additionally, "cooling" shall refer to the circulation of cool air. Further, "cooling" shall also refer to providing a flow of air (e.g., with a fan) to cool equipment. Accordingly, a "higher level of cooling" may include providing electronic equipment with one or more of a lower ambient temperature, circulation of cooler air, and a greater volumetric flow of air.

Figure 2:
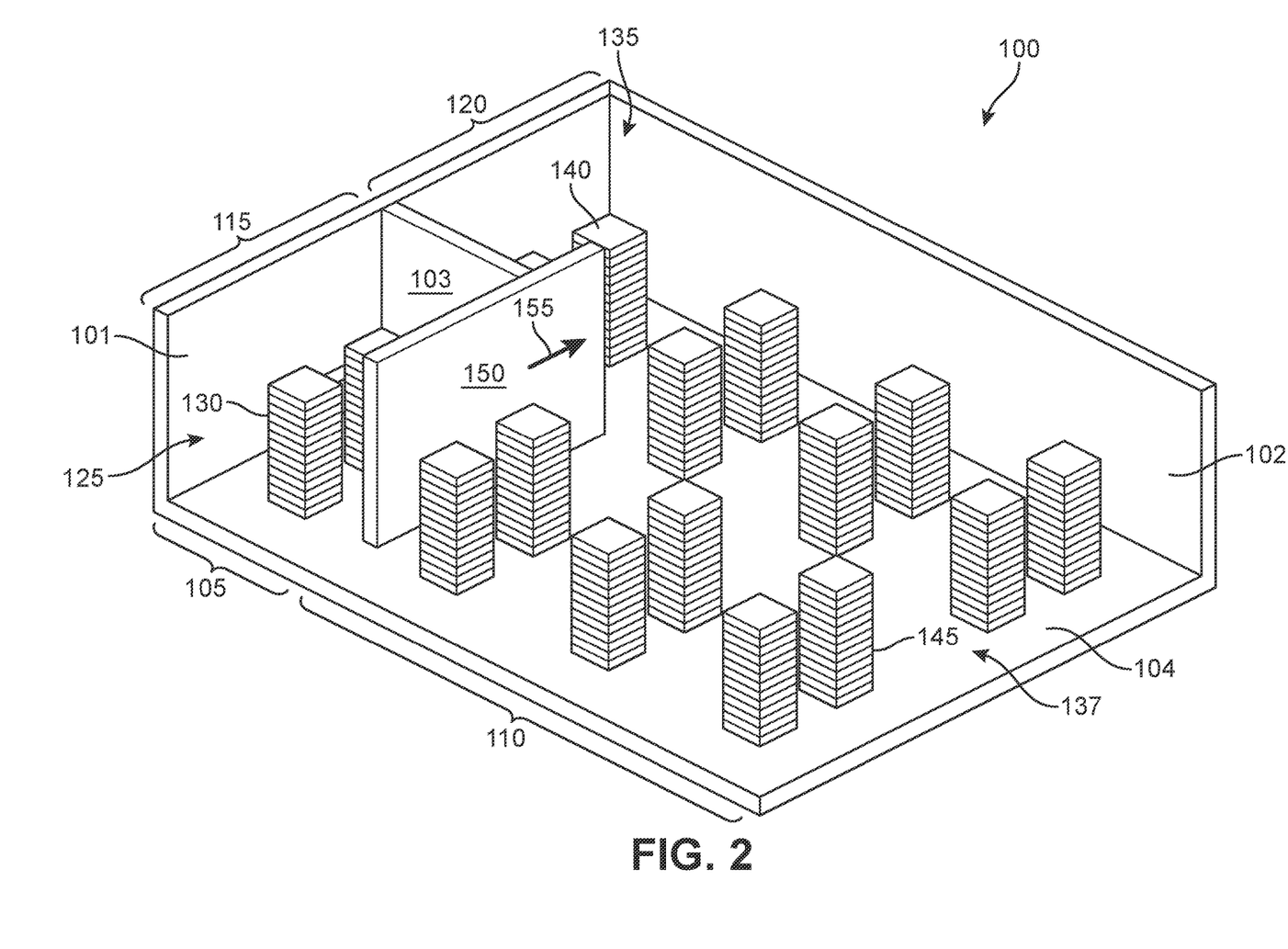
FIG. 2 is a schematic top perspective view of the electronic equipment room of FIG. 1 showing the movable wall partition moving toward a second position.
Figure 3:
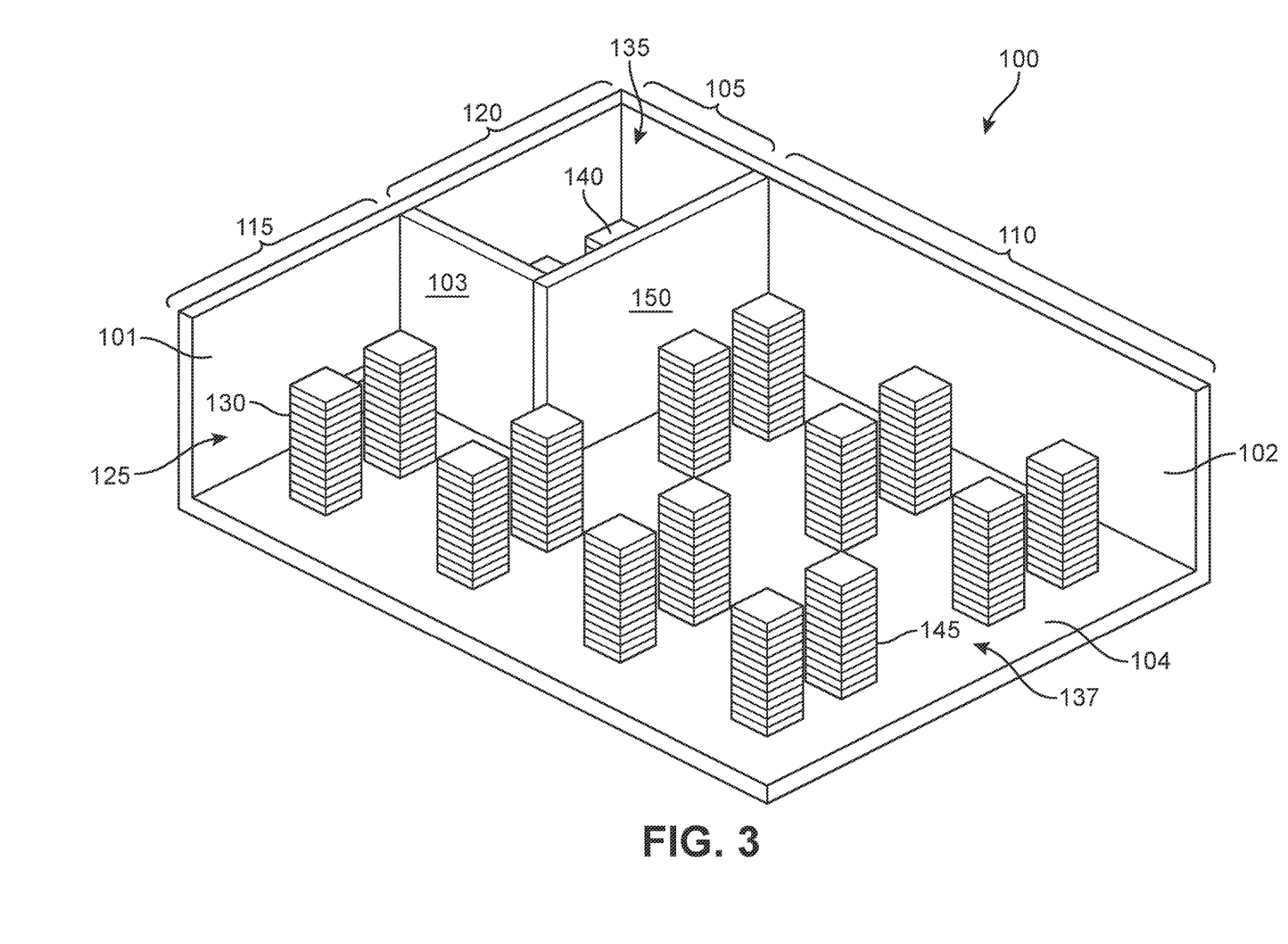
FIG. 3 is a schematic top perspective view of the electronic equipment room of FIG. 1 showing the movable wall partition in the second position.

In some embodiments, interior wall partition 150 may be movable. For example, in some cases, interior wall partition 150 may be movable from a first position enclosing a first area of the room to a second position enclosing a second area of the room. FIG. 1 shows interior wall partition 150 in a first position, enclosing first area 125 of room 100 to form a small subchamber, with second area 135 and third area 137 combined to form a large subchamber. FIG. 2 is an illustration of equipment room 100 showing interior wall partition 150 moving toward a second position, as indicated by an arrow 155. FIG. 3 shows equipment room 100 with interior wall partition 150 disposed in a second position enclosing second area 135 to form a small subchamber. With interior wall partition 150 in this second position, first area 125 and second area 137 are combined to form a large subchamber.

As shown in FIGS. 1-3, interior wall partition 150 moves in a generally linear direction along the length of the partition. It will be understood, however, that the movement of the movable partition may vary. For example, in some embodiments, the movable partition may pivot, fold, telescope, tip, tilt, and/or rotate in order to move from a first position enclosing a first area to a second position enclosing a different area of the room. In some embodiments, the movement of the partition may be automated. The movement of the partition may be performed by any sort of equipment, such as winches, servo-actuators, pulley systems, etc. In some embodiments, automated movement of the partition may be computer controlled, for example, using a system controller such as that described in greater detail below.

In order to provide different levels of cooling to different areas of the room, and therefore to different subchambers defined by interior partitions, multiple heating, ventilation, and air conditioning (HVAC) units may be provided.

Figure 4:
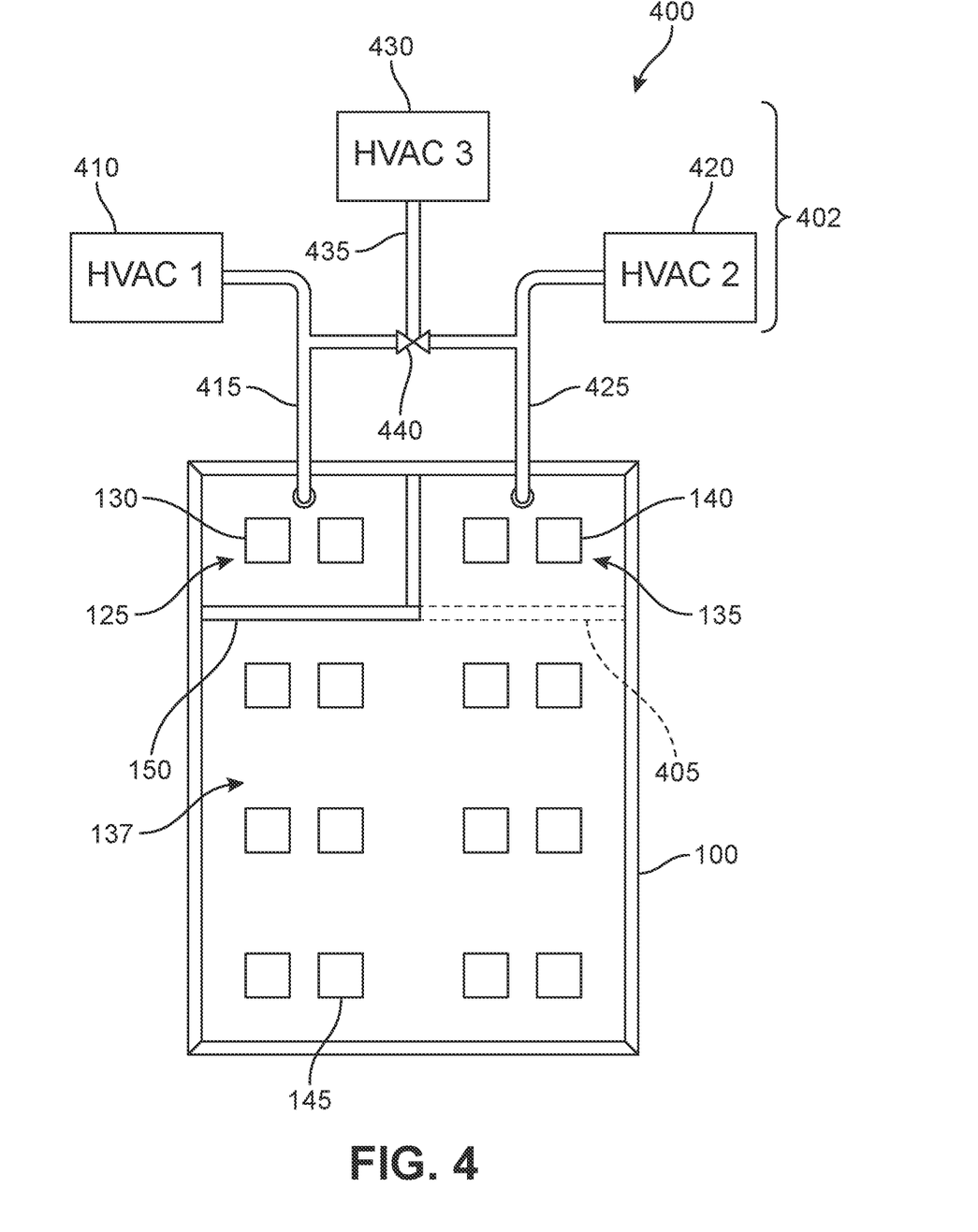
FIG. 4 is a schematic illustration of the electronic equipment room of FIGS. 1-3 and an associated HVAC system.

FIG. 4 is a schematic illustration of a climate control system 400 for electronic equipment. Climate control system 400 may include electronic equipment room 100 of FIGS. 1-3 and an associated HVAC system 402. As shown in FIG. 4, a first subchamber defined in first area 125 may be cooled by a first HVAC unit 410 (e.g., via a first duct 415) and a second subchamber defined by second area 135 and third area 137 is cooled by a second HVAC unit 420 (e.g., via a second duct 425). With such an arrangement, climate control system 400 may be configured to provide a higher level of cooling to the first subchamber, because first piece of equipment 130 requires more cooling (e.g., a lower ambient temperature) than the equipment in second area 135 or third area 137. In order to provide a higher level of cooling in the first subchamber, first HVAC unit 410 may be operated at a lower thermostat setting, a higher fan speed, or other setting that provides more cooling compared to corresponding settings of second HVAC unit 420.

It will be noted that, in some cases, the larger subchamber may be provided with a higher level of cooling than the smaller subchamber. It will also be noted that, in some embodiments, subchambers receiving different levels of cooling may have the same or similar sizes. In some cases, the room may be divided into more than two subchambers. In such cases, more than two HVAC units may be utilized to provide more than two levels of cooling to the different subchambers. Further, the room may be provided with more than one movable partition in order to provide a greater number of arrangements for subchambers in the room.

In addition, with multiple HVAC units, each HVAC unit can be used to provide auxiliary or backup heating, ventilation, and air conditioning in the event other HVAC units are down, either due to failure, routine service, building construction/renovation, or any other reason. Accordingly, the system may be configured to use the first HVAC unit to provide backup cooling to the area that is enclosable to form the second subchamber and to use the second HVAC unit to provide backup cooling to the area that is enclosable to form the first subchamber. In some cases, a third HVAC unit may be provided that is configured to provide backup for either or both of the first HVAC unit and/or the second HVAC unit.

As shown in FIG. 4, cooling system 402 may include a third HVAC unit 430. First HVAC unit 410 and second HVAC unit 420 may provide backup to each other. In addition, third HVAC unit 430 may provide backup to either or both of first HVAC unit 410 and second HVAC unit 420 (e.g., via a third duct 435). As shown in FIG. 4, the regulation of airflow from the respective HVAC units and the equipment room may be managed by a valve 440. In one setting, valve 440 may be open between first HVAC unit 410 and second HVAC unit 420. In this setting, if first HVAC unit 410 is off and second HVAC unit 420 is on, airflow may be provided by second HVAC unit not only to second area 135 via second duct 425, but across to first duct 415 and into first area 125. If, on the other hand, second HVAC unit 420 is off, and first HVAC unit 410 is on, valve 440 permits flow of air in the opposite direction, i.e., from first HVAC unit 420 and first duct 415 to second duct 425 and into second area 135.

In addition, in another setting, valve 440 may permit airflow from third HVAC unit to first duct 415, to second duct 425, or to both first duct 415 and second duct 425. Accordingly, third HVAC unit 430 may provide cooling as backup to either or both first HVAC unit 410 and second HVAC unit 420. It will be noted that, the HVAC arrangement depicted in FIG. 4, is exemplary only, and many other configurations in which multiple HVAC units provide backup for one another are possible.

By providing different cooling to different subchambers in equipment room 100, system 400 may more efficiently and/or effectively cool equipment having differing cooling requirements. To facilitate such differential cooling, pieces of equipment having similar cooling requirements may be located proximate to one another, specifically within an area that may be enclosed to form a subchamber. With equipment having similar cooling requirements housed in the same subchamber, system 400 may avoid providing excess cooling for certain equipment. For example, if only a few pieces of equipment require an ambient temperature of 70 degrees Fahrenheit, and none of the other pieces of equipment in the room require an ambient temperature below 80 degrees Fahrenheit, it is inefficient to expend the energy to maintain the entire room at 70 degrees Fahrenheit. With system 400, the several pieces of equipment that require an ambient temperature of 70 degrees Fahrenheit may be housed in a small subchamber maintained at 70 degrees, and the rest of the equipment may be disposed in a larger subchamber maintained at 80 degrees.

Certain computing processes are known to generate more heat than others. For example, equipment that uses WIFI communication may generate significant amounts of heat, and thus more energy may be required to maintain this equipment at the require temperature. Thus, even though a WIFI device and a non-WIFI device are required to be maintained at the same ambient temperature, more energy may be required to maintain the WIFI device at the same temperature because of the additional heat produced by the WIFI device. Accordingly, for similar reasons to those discussed above, energy savings may be realized by system 400 by locating the hotter running equipment, such as WIFI devices, in a common subchamber. While the ambient temperature in such a subchamber may not necessarily be kept any lower than in the rest of the equipment room, the HVAC unit may need to run more often or generally work harder to maintain that same ambient temperature. By limiting this requirement to a small subchamber, the amount of additional energy expenditure may be minimized. For these reasons, in some embodiments, in system 400, electronic equipment that uses WIFI may be disposed in a subchamber to which greater cooling is provided than other areas of the equipment room.

Figure 5:
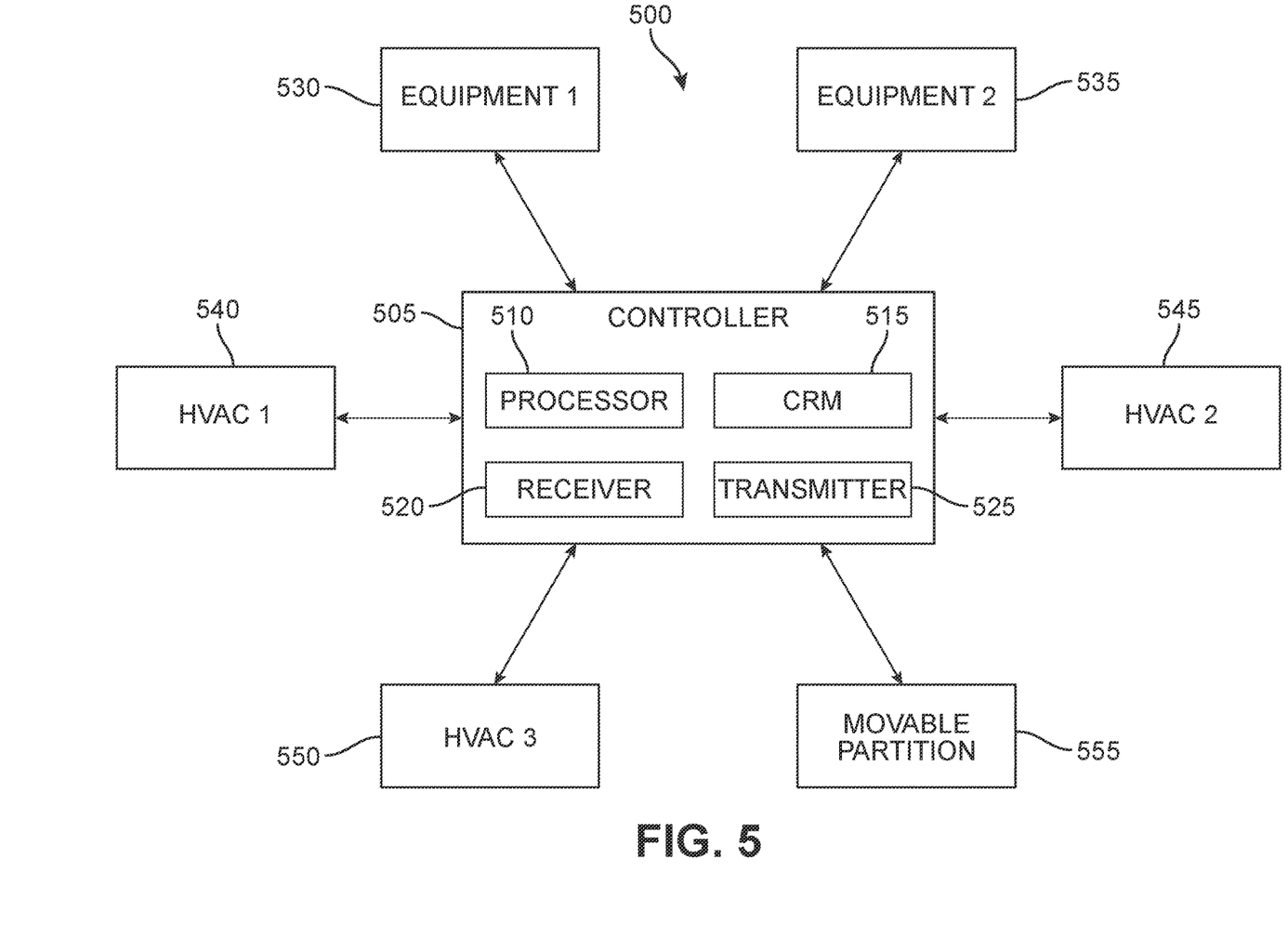
FIG. 5 is a block diagram illustrating a system for cooling equipment in an electronic equipment room.

FIG. 5 is a block diagram illustrating a system for cooling equipment in an electronic equipment room. A climate control system 500 for electronic equipment may include an electronic equipment room including a plurality of peripheral walls defining a chamber (see FIGS. 1-4) configured to receive a plurality of pieces of electronic equipment, such as a first piece of equipment 530 and a second piece of equipment 535.

As also discussed above with respect to FIGS. 1-4, the equipment room may also include one or more interior partitions dividing the chamber into two or more subchambers. In some embodiments, system 500 may include a movable partition 555, which may be configured similarly to wall partition 150 discussed above.

In addition, as shown in FIG. 5, climate control system 500 may include a cooling system configured to provide the two or more subchambers with different levels of cooling. The cooling system may include two or more HVAC units, such as a first HVAC unit 540 and a second HVAC unit 545. In some embodiments, system 500 may include a third HVAC unit 550.

Controller 505 may include various computing and communications hardware, such as servers, integrated circuits, displays, etc. Further, controller 505 may include a device processor 510 and a non-transitory computer readable medium 515 including instructions executable by device processor 510 to perform the processes discussed herein.

The non-transitory computer readable medium may include any suitable computer readable medium, such as a memory, e.g., RAM, ROM, flash memory, or any other type of memory known in the art. In some embodiments, the non-transitory computer readable medium may include, for example, an electronic storage device, a magnetic storage device, an optical storage device, an electromagnetic storage device, a semiconductor storage device, or any suitable combination of such devices. More specific examples of the non-transitory computer readable medium may include a portable computer diskette, a floppy disk, a hard disk, a read-only memory (ROM), a random access memory (RAM), a static random access memory (SRAM), a portable compact disc read-only memory (CD-ROM), an erasable programmable read-only memory (EPROM or Flash memory), a digital versatile disk (DVD), a memory stick, and any suitable combination of these exemplary media. A non-transitory computer readable medium, as used herein, is not to be construed as being transitory signals, such as radio waves or other freely propagating electromagnetic waves, electromagnetic waves propagating through a waveguide or other transmission media (e.g., light pulses passing through a fiber-optic cable), or electrical signals transmitted through a wire.

Instructions stored on the non-transitory computer readable medium for carrying out operations of the present invention may be instruction-set-architecture (ISA) instructions, assembler instructions, machine instructions, machine dependent instructions, microcode, firmware instructions, configuration data for integrated circuitry, state-setting data, or source code or object code written in any of one or more programming languages, including an object oriented programming language such as Smalltalk, C++, or suitable language, and procedural programming languages, such as the "C" programming language or similar programming languages.

Aspects of the present disclosure are described in association with figures illustrating flowcharts and/or block diagrams of methods, apparatus (systems), and computing products. It will be understood that each block of the flowcharts and/or block diagrams can be implemented by computer readable instructions. The flowcharts and block diagrams in the figures illustrate the architecture, functionality, and operation of possible implementations of various disclosed embodiments. Accordingly, each block in the flowchart or block diagrams may represent a module, segment, or portion of instructions. In some implementations, the functions set forth in the figures and claims may occur in an alternative order than listed and/or illustrated.

Controller 505 may include networking hardware configured to interface with other nodes of a network, such as a LAN, WLAN, or other networks. In Further, controller 505 may be configured to receive data from a plurality of sources and communicate information to one or more external destinations. Accordingly, controller 505 may include a receiver 520 and a transmitter 525. (It will be appreciated that, in some embodiments, the receiver and transmitter may be combined in a transceiver.) In some cases, communications between components may be made via the Internet, a cellular network, or other suitable communications network.

Any suitable communication platforms and/or protocols may be utilized for communication between controller 505 and other components of the system. Since the various sources of information may each have their own platform and/or protocol, system 500 may be configured to interface with each platform and/or protocol to receive the data.

System 500 may be configured to optimize cooling of the equipment. In some embodiments, system 500 may be configured to change the configuration of wall partitions, e.g., by moving movable wall partition 555, to enclose areas in which heat generating processing is being carried out. Alternatively, or additionally, system 500 may be configured to divert heat generating processing to equipment disposed in a location (e.g., subchamber) that is provided with a higher level of cooling.

In some embodiments, the computer readable medium may include instructions for controlling operation of movable partition 555 to enclose equipment having similar cooling requirements in the same subchamber of the equipment room. For example, in some cases, the equipment room may contain two or more pieces of equipment configured to handle internet data. The movable partition may be operated to enclose areas of the room in which equipment is handling high levels of internet traffic.

Figure 6:
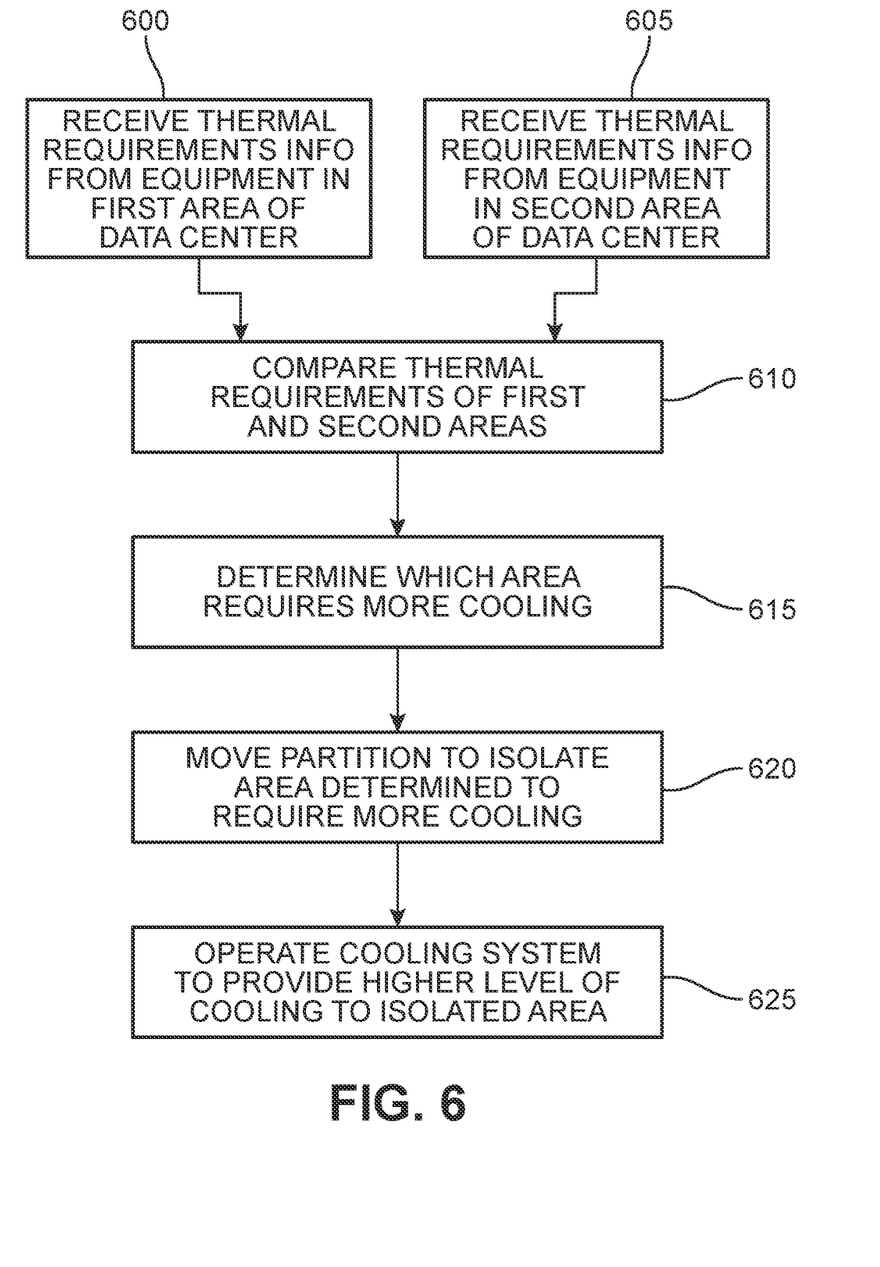
FIG. 6 is a flowchart illustrating a process of cooling equipment in an electronic equipment room.

FIG. 6 is a flowchart illustrating a process of cooling equipment in an electronic equipment room. As shown in FIG. 6, in some embodiments, the method may include receiving, with a system controller, thermal requirements information from electronic equipment in a first area of a data center chamber. (Step 600.) The method may also include receiving, with the system controller, thermal requirements information from electronic equipment in a second area of a data center. (Step 605.) Thermal requirements information may include any data regarding the thermal requirements of equipment. For example, such data may include manufacturer suggested conditions (e.g., to maintain the ambient temperature below a predetermined level). Such data may include actual temperature measurements taken by or of the equipment and/or the subchamber in which the equipment is disposed. Any suitable devices and methods may be utilized to obtain and/or receive this thermal requirements information.

In addition, the method may include comparing, with the system controller, the thermal requirements of the equipment in the first area to the thermal requirements of the equipment in the second area. (Step 610.) Further, the method may include determining which area requires more cooling than the other. (Step 615.) Based on this information, the method may include controlling operation of a movable partition based on the comparative cooling requirements of the electronic equipment in the first and second areas to selectively divide the data center chamber into two or more subchambers, including a first subchamber including the first area of the data center chamber and the second subchamber including the second area of the data center chamber. (Step 620.) Also, the method may include operating a cooling system to provide the first subchamber and the second subchamber with different levels of cooling from one another based on the comparative cooling requirements of the electronic equipment in the first and second areas. (Step 625.)

In some embodiments, the computer readable medium may include instructions for directing internet traffic (or other heat producing processes) through equipment disposed in a subchamber receiving a higher level of cooling. Such a process is discussed below with respect to FIG. 7. It will be noted that, this process may be done in lieu of, or in conjunction with, the method of controlling a movable partition, as discussed above with respect to FIG. 6.

Figure 7:
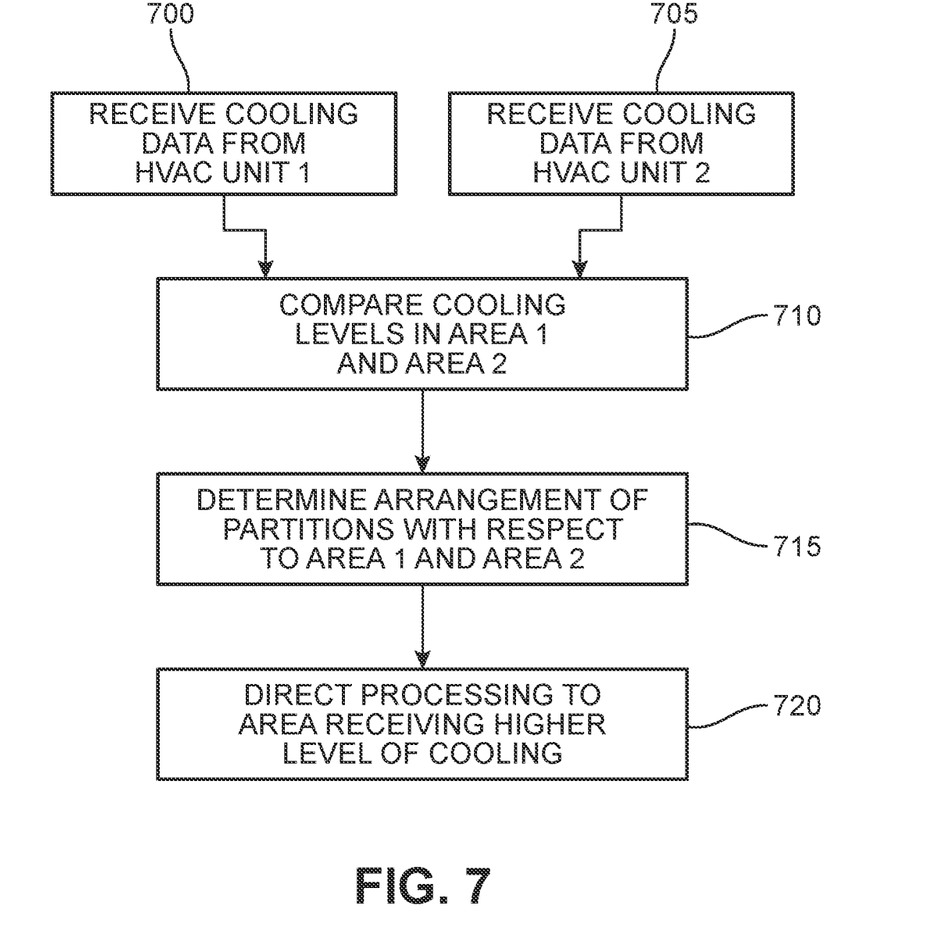
FIG. 7 is a flowchart illustrating another process of cooling equipment in an electronic equipment room.

FIG. 7 is a flowchart illustrating another process of cooling equipment in an electronic equipment room. As shown in FIG. 7, the method may include receiving, with a controller, cooling data from a first HVAC unit (step 700) and receiving, with a controller, cooling data from a second HVAC unit (step 705). This cooling data may include thermostat settings, temperature readings of subchamber and/or individual pieces of equipment, thermal loads on the HVAC units, electricity/fuel usage of the HVAC units, or any other data that is indicative of the level of cooling being provided in the respective areas/subchambers of the room.

In addition, the method may include comparing the level of cooling being provided by the two HVAC units in a first area of the room (being cooled by the first HVAC unit) and a second area of the room (being cooled by the second HVAC unit). (Step 710.) The method may also include determining, with the controller, the arrangement of partitions within the room with respect to the first area and the second area. (Step 715.) Further, the method may include directing processing functions to equipment in the area that is receiving a higher level of cooling. (Step 720.)

The steps above may be performed by, or at the direction of, the system controller. That is, the computer readable medium associated with the controller may include instructions for performing the steps described above.

In order to execute these processes, in some embodiments, the computer readable medium may include instructions for using machine learning to determine where the most cooling is needed in the room and/or where the processing should be routed in order to coincide with the higher levels of cooling being provided.

The embodiments discussed herein may make use of methods and systems in artificial intelligence to improve efficiency and effectiveness of the disclosed systems. As used herein, "artificial intelligence" may include any known methods in machine learning and related fields. As examples, artificial intelligence may include systems and methods used in deep learning and machine vision.

While various embodiments have been described, the description is intended to be exemplary, rather than limiting, and it will be apparent to those of ordinary skill in the art that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with, or substituted for, any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

We claim:

1. A climate control system for electronic equipment, comprising:
    an electronic equipment room including a plurality of peripheral walls defining a chamber configured to receive a plurality of pieces of electronic equipment and having one or more interior partitions dividing the chamber into two or more subchambers;
    a cooling system configured to provide the two or more subchambers with different levels of cooling;
    wherein at least one partition of the one or more interior partitions is movable from a first position defining a first subchamber to a second position defining a second subchamber in a different area of the room than the first subchamber;
    a system controller having a device processor and a non-transitory computer readable medium including instructions executable by the device processor for controlling operation of the movable partition based on cooling requirements of the electronic equipment in the room; and
    wherein the electronic equipment room contains two or more pieces of equipment configured to handle internet data; and
    wherein the computer readable medium further includes instructions for directing internet traffic through equipment disposed in a subchamber receiving a higher level of cooling.

2. The climate control system of claim 1, wherein the level of cooling is defined by one or more of the following:
    ambient temperature;
    circulation of cool air; and
    volumetric flow of air.

3. The climate control system of claim 1, wherein the computer readable medium includes instructions for using machine learning to determine where the most cooling is needed in the room.

4. The climate control system of claim 1, wherein electronic equipment that uses WIFI is disposed in a subchamber to which greater cooling is provided than other areas of the equipment room.

5. The climate control system of claim 1, wherein the room contains two or more pieces of equipment configured to handle internet data; and
    wherein the computer readable medium includes instructions for:
        controlling operation of the movable partition to enclose equipment having similar cooling requirements in a subchamber of the room.

6. A method of climate control for electronic equipment, comprising:
    using a device processor and a non-transitory computer readable medium to provide two or more subchambers of an electronic equipment room with different levels of cooling by moving an interior movable partition from a first position defining a first subchamber to a second position defining a second subchamber in a different area of the room than the first subchamber;
    wherein operation of the movable partition is performed based on cooling requirements of electronic equipment in the room;
    wherein the electronic equipment room contains two or more pieces of equipment configured to handle internet data; and wherein the computer readable medium further includes instructions for directing internet traffic through equipment disposed in a subchamber receiving a higher level of cooling.

7. The method of claim 6, further including controlling operation of the movable partition to enclose equipment having similar cooling requirements in a subchamber of the room.

8. The method of claim 6, further including providing greater cooling in a subchamber where electronic equipment that uses WIFI is disposed.

9. The method of claim 6, wherein the computer readable medium includes instructions for using machine learning to determine where the most cooling is needed in the room.

10. The method of claim 6, wherein the level of cooling is defined by one or more of the following:
   ambient temperature;
   circulation of cool air; and
   volumetric flow of air.

11. A climate control system, comprising:
   a room including a plurality of peripheral walls defining a chamber and having one or more interior partitions dividing the chamber into two or more subchambers;
   a cooling system configured to provide the two or more subchambers with different levels of cooling;
   wherein at least one partition of the one or more interior partitions is movable from a first position defining a first subchamber to a second position defining a second subchamber in a different area of the room than the first subchamber;
   a system controller having a device processor and a non-transitory computer readable medium including instructions executable by the device processor for controlling operation of the movable partition;
   wherein the electronic equipment room contains two or more pieces of equipment configured to handle internet data; and
   wherein the computer readable medium further includes instructions for directing internet traffic through equipment disposed in a subchamber receiving a higher level of cooling.

12. The climate control system of claim 11, wherein the level of cooling is defined by one or more of the following:
   ambient temperature;
   circulation of cool air; and
   volumetric flow of air.

13. The climate control system of claim 11, wherein the computer readable medium includes instructions for using machine learning to determine where the most cooling is needed in the room.

14. The climate control system of claim 11, wherein electronic equipment that uses WIFI is disposed in a subchamber to which greater cooling is provided than other areas of the equipment room.

15. The climate control system of claim 11, wherein the computer readable medium includes instructions for controlling operation of the movable partition to enclose equipment having similar cooling requirements in a subchamber of the room.

* * * * *